United States Patent
Fujioka

[11] Patent Number: 5,206,787
[45] Date of Patent: Apr. 27, 1993

[54] CAPACITOR AND METHOD OF FABRICATING SAME

[75] Inventor: Hiroshi Fujioka, Kawasaki, Japan

[73] Assignee: Fujitsu Limited, Kawasaki, Japan

[21] Appl. No.: 859,109

[22] Filed: Mar. 27, 1992

[30] Foreign Application Priority Data

Apr. 1, 1991 [JP] Japan .................. 3-67496

[51] Int. Cl.$^5$ .................. H01G 4/06; H01L 21/70
[52] U.S. Cl. .................. 257/307; 437/52; 257/77; 257/308
[58] Field of Search .................. 361/311-313; 357/51, 23.6; 437/52; 365/174

[56] References Cited

U.S. PATENT DOCUMENTS

| | | | |
|---|---|---|---|
| 5,006,481 | 4/1991 | Chan et al. | 437/52 |
| 5,053,351 | 10/1991 | Fazan et al. | 437/52 |
| 5,071,781 | 12/1991 | Seo et al. | 437/52 X |
| 5,082,806 | 1/1992 | Dulin | 252/62.3 BT |

FOREIGN PATENT DOCUMENTS

| | | |
|---|---|---|
| 0487951 | 6/1992 | European Pat. Off. |
| 59-175153 | 10/1984 | Japan . |
| 63-240057 | 10/1988 | Japan . |
| 1-120050 | 5/1989 | Japan . |
| 1-278061 | 11/1989 | Japan . |
| 2-040949 | 2/1990 | Japan . |
| 2-076258 | 3/1990 | Japan . |
| 2-267962 | 11/1990 | Japan . |

OTHER PUBLICATIONS

Patent Abstracts of Japan, vol. 9, No. 31 (E-295)(1754) Feb. 9, 1985 & JP-A-59 175153 (Nippon Denki K. K.)) Oct. 3, 1984.
Patent Abstracts of Japan, vol. 13, No. 46 (E-711)(3394) Feb. 2, 1989 & JP-A-63 240057 (Fujitsu Ltd) Oct. 5, 1988.
Patent Abstracts of Japan, vol. 13, No. 359 (E-804)(3707) Aug. 10, 1989 & JP-A-1 120050 (Hitachi Ltd) May 12, 1989.
Patent Abstracts of Japan, vol. 14, No. 51 (E-881) Jan. 30, 1990 & JP-A-1 278061 (Fujitsu Ltd) Nov. 8, 1989.
Patent Abstracts of Japan, vol. 14, No. 194 (E-919)(4137) Apr. 20, 1990 & JP-A-2 040949 (Sony Corp) Feb. 9, 1990.
Patent Abstracts of Japan, vol. 14, No. 255 (E-935)(4198) May 31, 1990 & JP-A-2 076258 (Fujitsu Ltd) Mar. 15, 1990.
Patent Abstracts of Japan, vol. 15, No. 22 (E-1024) Jan. 18, 1991 & JP-A-2 267962 (Nec Corp) Nov. 1, 1990.

*Primary Examiner*—Donald A. Griffin
*Attorney, Agent, or Firm*—Staas & Halsey

[57] ABSTRACT

A stacked capacitor having a fin structure, and a method of fabrication. A first electrode with a fin structure is formed on a semiconductor substrate and a second electrode is formed over the first electrode and spaced therefrom by a dielectric film. The first electrode comprises an electrically conductive material, different from polycrystalline silicon, and a polycrystalline silicon film containing an impurity and covering the electrically conductive material. Thereby, the film thickness of the storage electrode of the fin capacitor is reduced and the corrugation of the surface of a memory device by the capacitor structure is mitigated.

8 Claims, 6 Drawing Sheets

Fig. 3(A) (PRESENT INVENTION)

CAPACITOR AND METHOD OF FABRICATING SAME

BACKGROUND OF THE INVENTION

1. Field of the Invention

This invention relates to a capacitor and a method of fabricating same. More particularly, it relates to a capacitor suitable for application to dynamic random access memories (DRAMs), and a method of fabricating same.

2. Description of the Related Art

Remarkable progress has been made in technologies required for accomplishing miniaturization and a multilayered structure, in semiconductor processes for producing semiconductor devices having a higher integration density and higher operation speed. In memory devices, however, the area occupied by a capacitor, and the capacitance hereof, must be further improved.

FIG. 4(A) is a sectional view of a storage electrode of a conventional capacitor, and FIG. 4(B) is a sectional view of a conventional fin-type stacked capacitor.

In these drawings, reference numeral 22 denotes a silicon (Si) substrate; 23 is a silicon nitride ($Si_3N_4$ film; 24 is a polycrystalline silicon (poly-Si) film; 25 is a storage electrode; 26 is a silicon nitride ($Si_3N_4$) film; 27 is a poly-Si film; 28 is an opposed electrode; and 29 is a fin-type stacked capacitor.

Conventionally, the storage electrode 25 of the fin-type stacked capacitor is composed of a single layer of the polycrystalline silicon (poly-Si) film 24, as shown in FIG. 4(A). Such a poly-Si film 24, however, is easily deformed or broken during etching or a thermal oxidation treatment, and therefore, to make it suitable for practical application, the poly-Si film 24 must be at least 1,000 Å thick.

If the thickness of the storage electrode 25 is great in a three-dimensional structure, such as the fin-type stacked capacitor 29, which is widely applied in DRAMs, etc., as shown in FIG. 4(B), the height of the multilayered fin structure becomes even greater, and thus a multilayered wiring film such as aluminum (Al) is easily broken due to the step structure of a gate electrode, etc., and consequently, it is difficult to improve the production yield and quality.

SUMMARY OF THE INVENTION

In view of the problems of the prior art described above, an object of the present invention is to mitigate the corrugation of the surface of a memory device by reducing the film thickness of the storage electrode of a fin-type stacked capacitor.

In a stacked capacitor having a fin structure formed on a semiconductor substrate, the object of the invention described above can be accomplished by providing a stacked capacitor storage comprising a first electrode with a fin structure formed on a semiconductor device and a second electrode formed over the first electrode via a dielectric film, characterized in that the first electrode consists of an electrically conductive material different from polycrystalline silicon and a polycrystalline silicon film containing an impurity covering the electrically conductive material.

A method of forming a stacked capacitor comprising a first electrode with a fin structure formed on a semiconductor device and a second electrode formed over the first electrode via a dielectric film according to the present invention comprises a) a step of alternately laminating an insulating film and a conductive film different from polycrystalline silicon on a substrate;

b) a step of forming an opening reaching a surface of said substrate from the laminate surface to expose the laminated conductive film in the opening;

c) a step of newly forming a conductive film different from a polycrystalline silicon on at least all surfaces of the opening and connecting the conductive film;

d) a step of removing said insulating film;

e) a step of covering the entire surface of the conductive film with the polycrystalline silicon film containing an impurity;

f) a step of forming a conductive film on the polycrystalline silicon film; and g) a step of forming a second electrode on the conductive film.

BRIEF DESCRIPTION OF THE DRAWINGS

The object and advantages of the present invention will become more apparent from the following description of a preferred embodiment, taken in connection with the accompanying drawings, in which:

FIGS. 3(A) and 3(B) respectively are graphs showing the capacitor capacitance of a capacitor according to the present invention, and that of a capacitor of a prior art example.

DESCRIPTION OF THE PREFERRED EMBODIMENTS

Figure 1A:
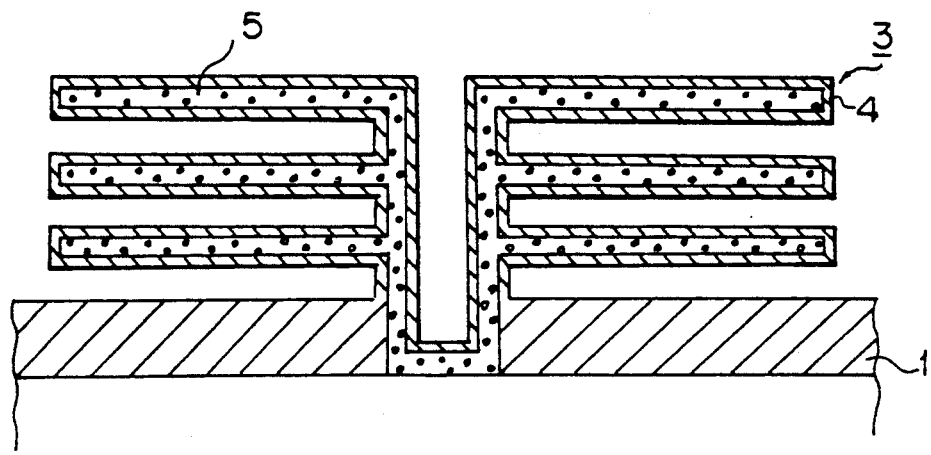
FIGS. 1(A) and 1(B) are explanatory views explaining the principle of the present invention.
Figure 1B:
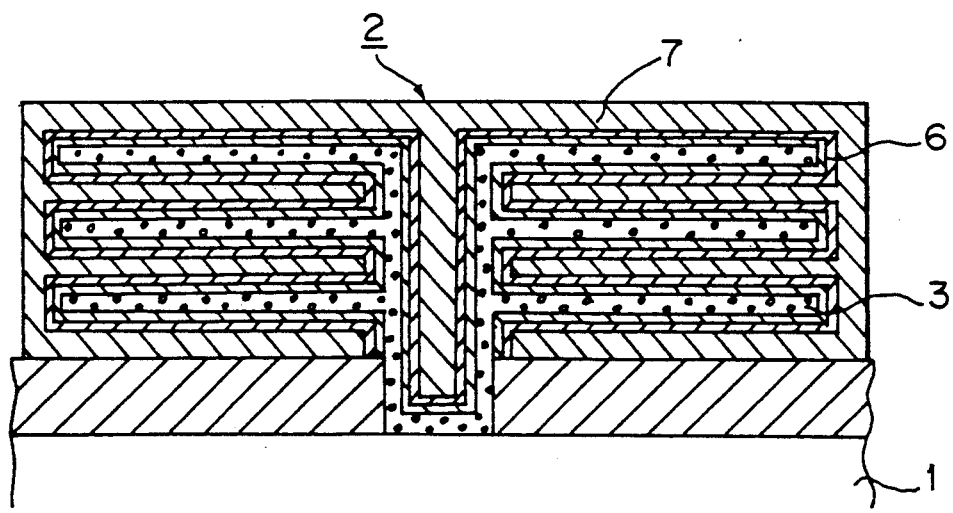

FIGS. 1(A) and 1(B) are sectional views for explaining the principle of the present invention.

Reference numeral 1 denotes a semiconductor substrate; 2 is a capacitor; 3 is a storage electrode; 4 is a polycrystalline silicon (poly-Si) film; 5 is a compound containing SiC; 6 is a dielectric film; and 7 is an opposed electrode.

As shown in FIG. 1(A), a stacked capacitor 2 having a fin structure according to the present invention is characterized in that the storage electrode 3 of the stacked capacitor 2 has a structure wherein an electrically conductive material 5 other than poly-Si is coated with a layer 4 of poly-Si and an impurity.

As shown in FIG. 1(B), in the stacked capacitor 2 having a fin structure according to the present invention, the surface of the storage electrode 3 is coated with the dielectric film 6, and the opposed electrode 7 is formed on this dielectric film.

In the present invention, the conductive material comprises a compound containing silicon carbide (SiC) and an impurity. The term "compound containing silicon carbide" as used herein means not only silicon carbide (SiC) but also other compounds such as SiCH, SiCHF, and SiCF. The resistance of compounds containing these silicon carbides can be remarkably reduced by doping same with an impurity, and they can be rendered conductive.

In the present invention, the electrically conductive material is made from a material having a higher strength than polysilicon. Also, the higher strength material, for example, can be a mixed crystal containing silicon carbides.

In addition to the materials described above, the conductive material in the present invention can be constituted by a silicide, and in this case, the doping of same with an impurity is not necessary. Examples of the silicides that can be used in the present invention include tungsten silicide, tantalum silicide, molybdenum silicide, and titanium silicide.

The doping of the impurity into the poly-Si film 4 described above can be accomplished by a thermal diffusion from the SiC-containing compound 5; it also can be accomplished by an in-situ doping by which the impurity is doped simultaneously with the growth of the poly-Si film.

Preferred examples of the impurities to be doped in the present invention include metals of the Group III (such as gallium, boron, indium, etc.) and metals of the Group V (such as antimony, arsenic, phosphorus, etc.) of the Periodic Table.

As described above, the storage electrode in the present invention is constituted by the material obtained by coating the thermally stable compound, such as the SiC-containing compound, with the poly-Si film, and therefore can solve the problems of the prior art as described above.

Namely, the Sic-containing compound has a higher strength and thermal stability than the poly-Si film, and has a sufficient strength even during an oxidation process of above 1,000° C., for example, and therefore, the thickness of the electrode can be reduced. Even in the multi-layered fin structure, therefore, corrugation of the device surface is lessened and a wiring process for Al, etc., can be simplified.

Since a coating by the Si film is carried out, the capacitor electric characteristics can be made equal to those of the poly-Si film single layer electrode.

Next, the present invention will be explained in further detail with reference to examples, but the invention is not limited to these examples.

EXAMPLE

The present invention will be explained as an embodiment thereof applied to a fin-type stacked capacitor of a DRAM, with reference to FIG. 2.

Figure 2A:
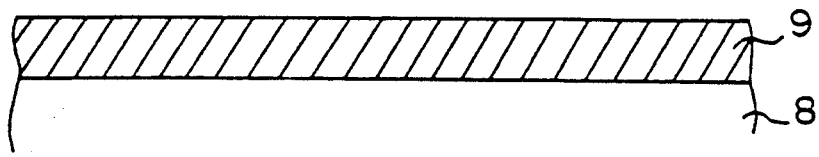
FIGS. 2(A) to 2(J) are sectional views showing steps in the process according to one embodiment of the present invention.

As shown in FIG. 2(A), a MOS device is formed on the Si substrate 8, up to the gate electrode thereof, and the silicon nitride ($Si_3N_4$) film 9 is deposited on the entire surface of the Si substrate 8.

Figure 2B:
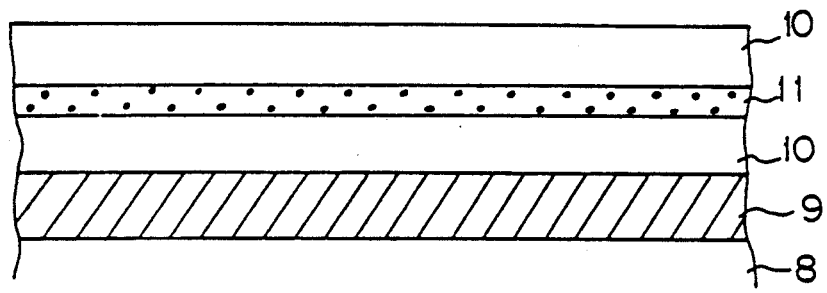
Figure 2C:
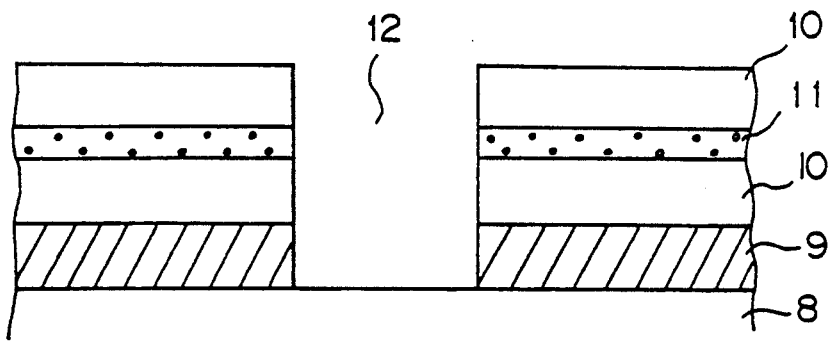

Next, as shown in FIG. 2(B), silicon dioxide ($SiO_2$) films 10 and an n-type polycrystalline SiC film 11 are alternately deposited to respective thicknesses of 1,000 Å and 500 Å by CVD, under the usual conditions for the former and under the following conditions for the latter, such that the upper and lower surfaces thereof become the $SiO_2$ film 10. Next, an opening 12 is formed by patterning the $SiO_2$ film 10, the SiC film 11, and the $Si_3N_4$ film 9 in such a manner that the Si substrate 8 is exposed in a capacitor formation region (FIG. 2(C)).

Here, the SiC film 11 is grown by supplying acetylene ($C_2H_2$) at a rate of 10 sccm, trichlorosilane ($SiHCl_3$) at a rate of 50 sccm, hydrogen ($H_2$) at a rate of 15 slm, phosphine at a rate of 0.1 sccm and hydrogen chloride (HCl) at a rate of 30 sccm, at a substrate temperature of 1,000° C. and a pressure of 20 Torrs.

In this example, phosphine ($PH_3$) is simultaneously supplied as an impurity to be doped into the SiC film 11, at a rate of 0.1 sccm.

Figure 2D:
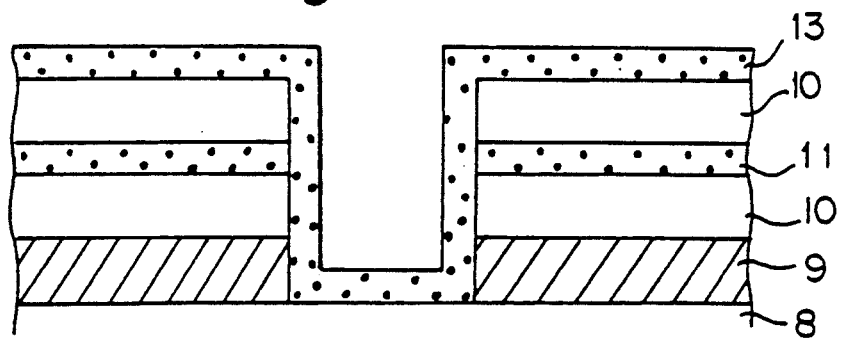

A SiC film 13 is deposited on the entire surface of the Si substrate 8 as shown in FIG. 2(D).

Figure 2E:
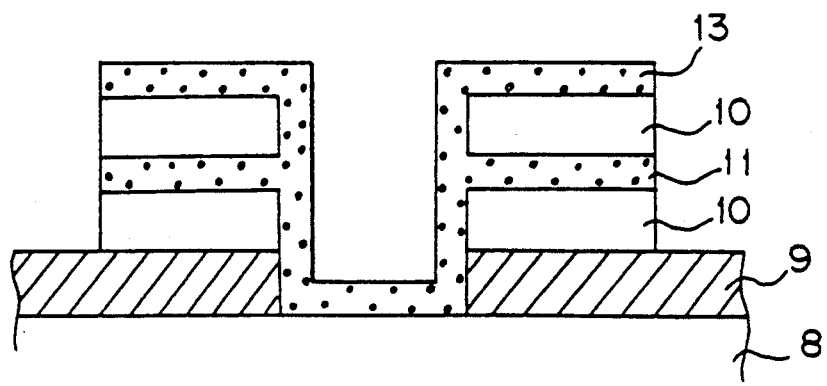
Figure 2F:
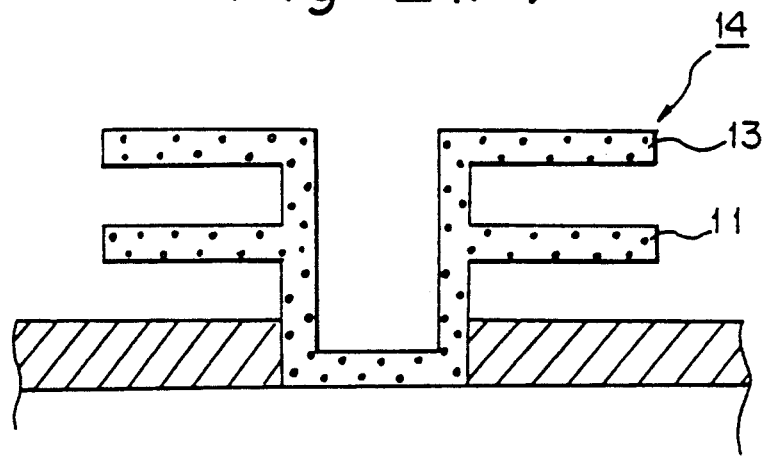

Furthermore, as shown in FIG. 2(E), the SiC films 11, 13, and the $SiO_2$ in regions other than the capacitor formation region, are etched and removed by a patterning process as shown in FIG. 2(E). The $SiO_2$ film 10 is etched and removed by a usual dry etching, and the SiC films 11 and 13, 13 are etched and removed by RIE by supplying chlorine ($Cl_2$) at a rate of 10 sccm and carbon tetrachloride ($CCl_4$) at a rate of 5 sccm, at a chamber internal pressure of 0.3 Torr and a discharge output of 800 W at 13.56 MHz.

The $SiO_2$ film 10 between the $Si_3N_4$ film a and the SiC film 11, and the $SiO_2$ film 10 between the SiC film 11 and the SiC film 13 are etched and removed, to thereby form an storage electrode 14 having a multi-layered fin structure.

Figure 2G:
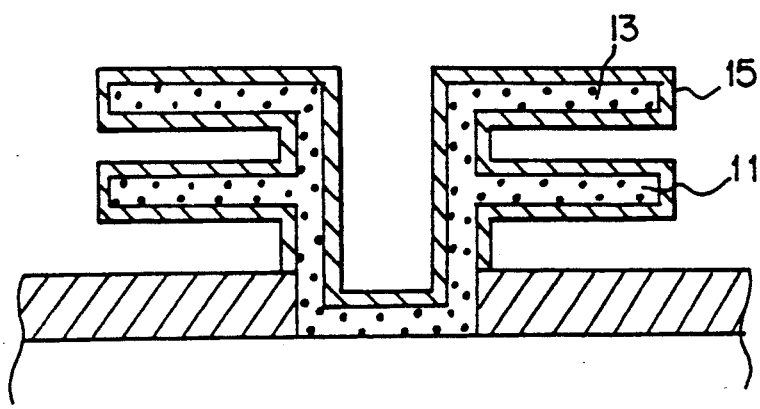

Thereafter, as shown in FIG. 2(G), poly-Si film 15 is selectively grown to a thickness of 200 Å, only on the SiC films 11, 13 by CVD while supplying $SiH_2Cl_2$ at a rate of 50 sccm, $H_2$ at a rate of 3 slm, $pH_3$ at a rate of 0.1 sccm and HCl at a rate of 30 sccm, at a substrate temperature of 800° C. and a pressure of 2 Torrs.

Figure 2H:
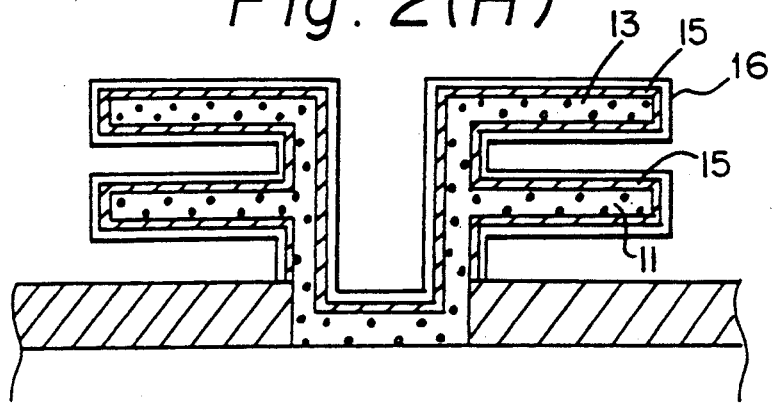

Subsequently, the surface of the poly-Si film 15 is oxidized to a depth of about 50 Å as shown in FIG. 2(H) to cause a change thereof to the $SiO_2$ film 16. At this time, phosphorus (P), as the impurity doped into the n-type SiC film 11, is thermally diffused into the poly-Si film 15 of the surface, whereby the resistance of the poly-Si film 15 is also reduced to a low level.

Figure 2I:
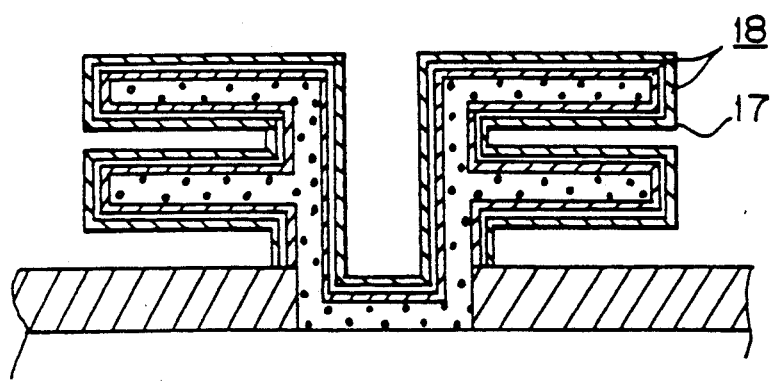

Next, a $Si_3N_4$ film 17 is deposited to a thickness of 50 Å on this $SiO_2$ film 16 by CVD, as shown in FIG. 2(I), to form a dielectric film 18. The conversion film thickness of this dielectric film 18 consisting of the $SiO_2$ film 16 and the $Si_3N_4$ film 17 of the capacitor 21 is 60 Å.

Figure 2J:
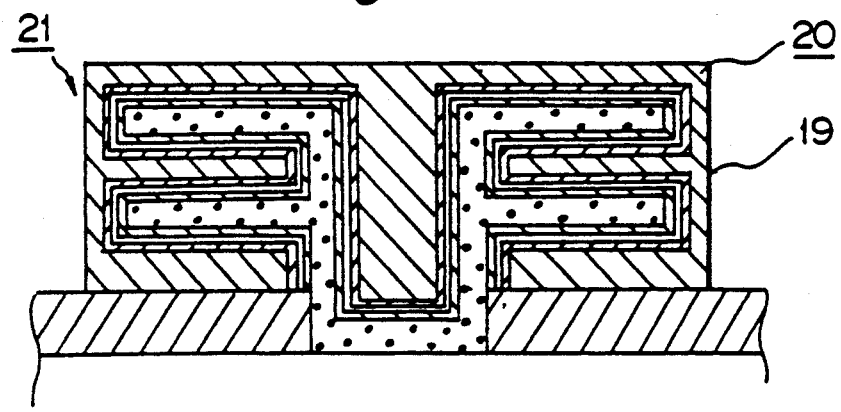

As shown in FIG. 2(J), a poly-Si film 19 is deposited to a thickness of 300 Å, to form an opposed electrode 20, and accordingly, a small area, large capacitance fin-type stacked capacitor 21 is completed.

Figure 3B:
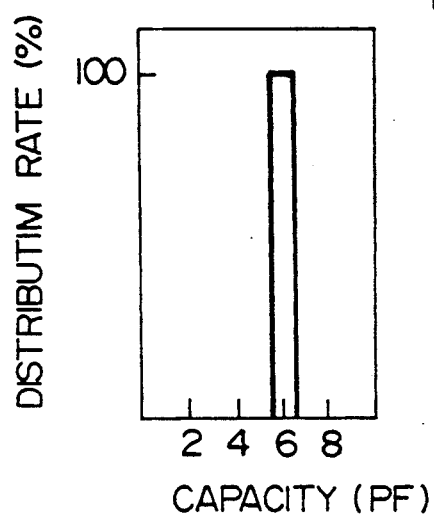
Figure 3B:
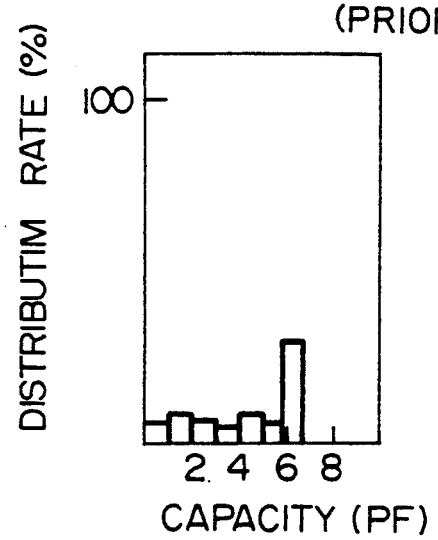
Figure 4A:
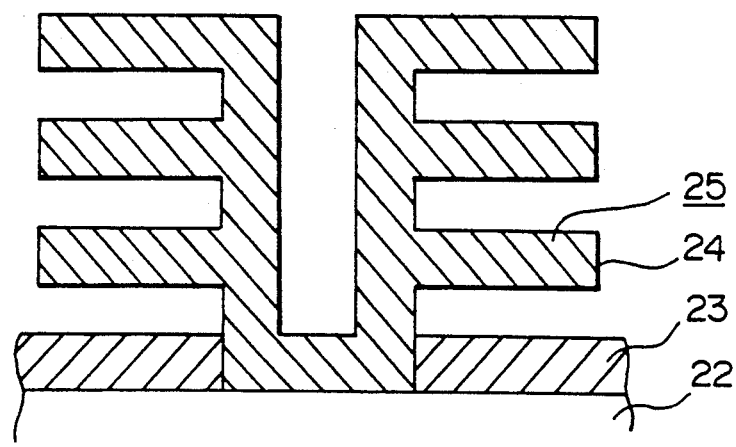
FIGS. 4(A) and 4(B) are sectional views showing the storage electrode of a conventional capacitor and a fin-type stacked capacitor, respectively.
Figure 4B:
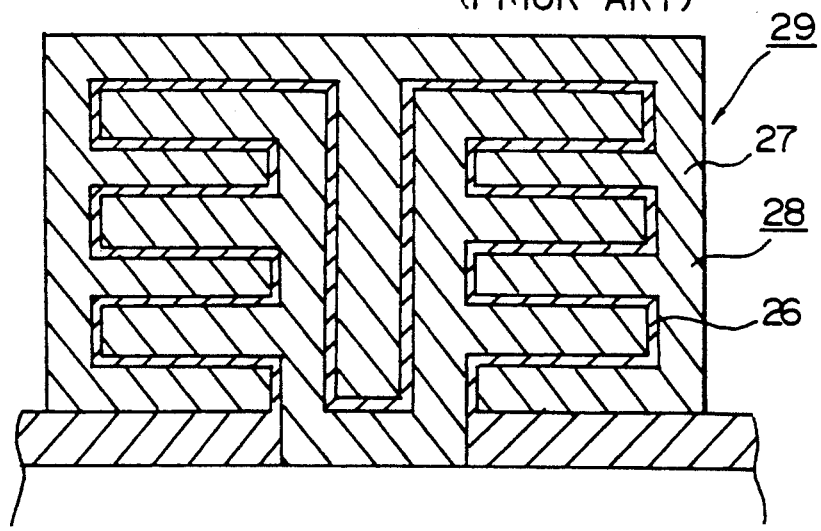

For comparison with the present invention, a prior art example is obtained by forming the fin of the storage electrode of a 900 Å-thick poly-Si film alone without using the SiC film, the capacitor capacitances therefore compared, and the results are shown in FIG. 3B.

As shown in FIG. 3(A), the storage electrode using the SiC film according to the present invention can provide a capacitor having a fin made of a thin storage electrode, whereas the prior art example using the conventional poly-Si alone exhibits a large variance of the capacitance and is very unstable (FIG. 3(B)).

As described above, the present invention can stably form a large capacitance capacitor, and greatly contributes to the realization of very-large scale integration DRAMs of above 1 G.

I claim:

1. A stacked capacitor comprising:
   a first electrode having a fin structure and formed on a semiconductor substrate;
   a dielectric film formed on the first electrode; and
   a second electrode formed on the dielectric film and spaced thereby from the first electrode;
   the first electrode comprising an electrically conductive material different from polycrystalline silicon and a polycrystalline silicon film containing an impurity and covering the electrically conductive material.

2. A stacked capacitor according to claim 1, in which the electrically conductive material has a higher strength than polysilicon.

3. A stacked capacitor according to claim 2, in which the higher strength material is a mixed crystal containing silicon carbide and an impurity.

4. A method of forming a stacked capacitor comprising a first electrode having a fin structure and formed on a semiconductor substrate, a dielectric film covering the first electrode, and a second electrode formed over the first electrode and spaced therefrom by the dielectric film, comprising:

a) forming alternating laminations of an insulating film and a conductive film, different from polycrystalline silicon, on a main surface of the substrate;

b) forming an opening extending from the laminate surface to the main surface of the substrate and thereby exposing the edges of each conductive film lamination in the sidewalls of the opening;

c) forming a further conductive film, of a material different from polycrystalline silicon, on at least all sidewall surfaces of the opening, the further conductive film covering and thereby contacting the exposed edges of each conductive film lamination;

d) removing each of said insulating film laminations;

e) covering the entire surface of each conductive film with polycrystalline silicon film containing an impurity and forming thereby the first electrode;

f) forming a further insulating film on the polycrystalline silicon film, as the dielectric film; and g) forming a second electrode on the further insulating film.

5. A method according to claim 4, in which the conductive film is made from a material having a higher mechanical strength than polycrystalline silicon.

6. A method according to claim 5, in which the higher mechanical strength material is a mixed crystal containing silicon carbide and an impurity.

7. A method according to claim 6, wherein step (e) further comprises doping the polycrystalline silicon film to produce the impurity therein by thermal diffusion of the impurity from the conductive material and into the polycrystalline silicon material when forming the polycrystalline silicon film for covering the conductive film therewith.

8. A method according to claim 4, wherein step (e) further comprises simultaneously doping the polycrystalline silicon film with the impurity while covering the conductive film therewith.

* * * * *

UNITED STATES PATENT AND TRADEMARK OFFICE
CERTIFICATE OF CORRECTION

PATENT NO. : 5,206,787
DATED : April 27, 1993
INVENTOR(S) : Hiroshi FUJIOKA

It is certified that error appears in the above-indentified patent and that said Letters Patent is hereby corrected as shown below:

Col. 2, line 33, delete "capacitor" (first occurrence).

Col. 4, line 16, change "film a" to --film 9--.

Signed and Sealed this

Fourteenth Day of June, 1994

Attest:

BRUCE LEHMAN

*Attesting Officer*   *Commissioner of Patents and Trademarks*